United States Patent
Mogami et al.

(10) Patent No.: US 6,459,126 B1
(45) Date of Patent: Oct. 1, 2002

(54) SEMICONDUCTOR DEVICE INCLUDING A MIS TRANSISTOR

(75) Inventors: Tohru Mogami, Tokyo (JP); Mitsuhiro Togo, Tokyo (JP); Koji Watanabe, Tokyo (JP); Toyoji Yamamoto, Tokyo (JP); Nobuyuki Ikarashi, Tokyo (JP); Kazutoshi Shiba, Tokyo (JP); Toru Tatsumi, Tokyo (JP); Haruhiko Ono, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/852,658

(22) Filed: May 11, 2001

(30) Foreign Application Priority Data

Nov. 30, 2000 (JP) .................. 2000-365180

(51) Int. Cl.[7] .............................. H01L 23/62
(52) U.S. Cl. ........................ 257/350; 257/344
(58) Field of Search ............... 257/350, 344; 438/241, 162, 406, 253; 156/628

(56) References Cited

U.S. PATENT DOCUMENTS

| | | | | |
|---|---|---|---|---|
| 4,601,779 A | * | 7/1986 | Abernathey et al. | 156/628 |
| 5,945,711 A | * | 8/1999 | Takemura et al. | 257/344 |
| 6,017,791 A | * | 1/2000 | Wang et al. | 438/253 |
| 6,063,686 A | * | 5/2000 | Masuda et al. | 438/406 |
| 6,168,980 B1 | * | 1/2001 | Yamazaki et al. | 438/162 |
| 6,333,222 B1 | * | 12/2001 | Kitazawa et al. | 438/241 |

FOREIGN PATENT DOCUMENTS

| | | | |
|---|---|---|---|
| JP | 2-256274 | 10/1990 | |
| JP | 6-140392 | 5/1994 | |
| JP | 02001127303 A | * 5/2001 | ......... H01L/29/786 |

OTHER PUBLICATIONS

E. P. Gusev et al., "Nitrogen engineering of ultrathin oxynitrides by a thermal $NO/O_2/NO$ process", *Journal of Applied Physics*, vol. 84, No. 5, Sep. 1998, pp. 2980–2982.

S. C. Song et al., "Formation of High Quality Oxynitride Gate Dielectrics by High Pressure Thermal Oxidation of Si in NO", *Mat. Res. Soc. Symp. Proc.*, vol. 567, 1999, pp. 65–70.

D. M. Brown et al., "Properties of $Si_2O_2N_2$ Films on Si", *J. Electrochem. Soc.*: Solid State Science, Mar. 1968, pp. 311–317.

\* cited by examiner

*Primary Examiner*—David Nelms
*Assistant Examiner*—Thinh Nguyen
(74) *Attorney, Agent, or Firm*—Sughrue Mion, PLLC

(57) ABSTRACT

A MIS transistor has a gate insulating film made of silicon oxynitride and having a specific dielectric constant which is larger than the expected specific dielectric constant calculated based on a weighted average of the specific dielectric constants based on the weight ratio of the silicon oxide and the silicon nitride contained in the silicon oxynitride film. The gate insulating film having a smaller thickness prevents impurities in the overlying gate electrode from penetrating through the gate insulating film to degrade the silicon substrate.

17 Claims, 11 Drawing Sheets

SEMICONDUCTOR DEVICE INCLUDING A MIS TRANSISTOR

BACKGROUND OF THE INVENTION (a) Field of the Invention

The present invention relates to a semiconductor device including a MIS (Metal-Insulator-Semiconductor) transistor, and more particularly, to the structures of a semiconductor device including a MIS transistor having a gate insulating film, which is capable of preventing impurities in an electrode from penetrating therethrough to degrade the transistor characteristics.

The present invention also relates to a method for manufacturing such a semiconductor device.

(b) Description of the Related Art

Along with reduction of the dimensions of semiconductor devices, gate insulating films have been rapidly reduced in thickness, and there is a need for an ultra thin gate insulating film having a thickness of 3 nm or less. However, a conventional silicon oxide film used for a gate insulating film and having such a small thickness suffers from the following phenomena or problems. Specifically, impurity (boron) ions in a gate electrode are thermally diffused and penetrate through the silicon oxide film to a silicon substrate. Meanwhile, a so-called direct tunneling effect is also caused by which electrons penetrate through the insulating film based on the quantum mechanical theory. These phenomena increase gate leakage current.

As a method of solving the problem of penetration through the silicon oxide film by the boron from the gate electrode, the use of a silicon oxynitride film produced by introducing nitrogen into a silicon oxide film has been proposed. As a conventional method of forming a silicon oxynitride film, formation of a gate insulating film by directly thermally oxynitriding a surface of a semiconductor substrate is known.

Many proposed methods use a rapid thermal treatment system to form an oxynitride film for a MOS (Metal Oxide Semiconductor) transistor. For example, an oxide film produced on a silicon substrate is thermally nitrided to form a silicon oxynitride film. Alternatively, a nitride film produced on a silicon substrate is thermally oxidized to form a silicon oxynitride film.

In the above processes, when oxidation is conducted to a nitride film directly formed on a silicon substrate, the nitrogen peak is generally positioned at the interface between the oxynitride film and the silicon substrate, and the interface state increases as a result. Therefore, normally, an oxide film is first formed and the film is then nitrided. For example, according to a method described by Japanese Patent Laid-Open Publication No. Hei. 2-256274, a thermally oxidized film is formed on a surface of a silicon substrate by pyrogenic oxidation, or dry oxygen oxidation, and then the film is allowed to thermally react with nitrogen in a nitriding gas ambient. Thus, nitrogen is introduced into the silicon oxide film. Herein, the nitriding gas may be a nitrogen gas, an ammonia gas, a nitrous oxide gas or a nitrogen monoxide gas For example, Japanese Patent Laid-Open Publication No. Hei. 6-140392 describes nitriding using plasma in order to solve the disadvantage associated with the above described thermal nitriding. In the plasma treatment, a semiconductor wafer having a silicon oxide film as thick as 4.0 nm formed on a silicon substrate is transported into a vacuum chamber, and heated up to temperatures in the range from 700° C. to 900° C. using a rapid thermal treatment system. Then, an ammonia gas is introduced as a nitriding gas, and a vacuum ultraviolet beam by Ar plasma generated at a vacuum ultraviolet plasma light emitting disc lamp is irradiated upon the wafer surface.

In the above plasma treatment, the ammonia gas is photodisintegrated by photo excitation, and the silicon oxide film is directly nitrided using resulting much reactive, high energy active nitrogen, so that a silicon oxynitride film is formed. In recent years, control of the nitrogen profile in a silicon oxynitride film has been recognized as an indispensable technique in forming a gate oxide film with superior electric characteristics.

Journal of Applied Physics, Vol.84, page 2980 (J. Appl. Phys. 84 (1998) 2980) describes a method of controlling the nitrogen position in such a gate oxynitride film by using a rapid thermal treatment system. More specifically, treatments with nitrogen monoxide, oxygen, and nitrogen monoxide are sequentially performed in this order, resulting in that the nitrogen in the gate oxynitride film is localized at both the interface and the surface of the gate oxynitride film having a thickness of 4.0 nm. In this structure, hot carrier resistance in the MOS transistor is improved by the nitrogen positioned at the interface. In addition, boron ions in the gate electrode can be prevented from penetrating to the silicon substrate by the nitrogen positioned at the surface.

In Material Research Society 1999, page 84 (MRS 1999 Spring Meeting Abstract 84), for improvement of the charge mobility in the channel region of a MOS transistor, the nitrogen position in the gate insulating film is allowed to reside at the center of the gate insulating film.

Meanwhile, it is reported that, in view of the function of controlling the gate leakage phenomenon, a silicon oxynitride film is equivalent to a silicon oxide film. In contrast, it has been reported that the use of high dielectric constant film other than a silicon oxide film, such as a high dielectric constant metal oxide film including an aluminum oxide film having a dielectric constant of 7 to 9 and a zirconium oxide film having a dielectric constant of 10, can reduce the gate leakage current more than the use of a silicon oxide film.

However, a high dielectric constant film other than the silicon oxide film suffers from significant disadvantages such as mismatching between a gate electrode and a polysilicon material, and degradation in thermal stability and heat resistance, which lead to degradation in the transistor characteristics. These are significant disadvantages in using the film in practice. Therefore, it is extremely important in next-generation fine transistors to reduce gate leakage current in a silicon-oxide-based insulating film having a thickness of 3.0 nm or less.

The silicon oxynitride film as described above is encountered with the following problems. Firstly, the dielectric constant of an ultra thin, silicon oxynitride film as thin as 3.0 nm or less cannot be higher than that of a silicon oxide film. A silicon oxynitride film, if it is possible for the silicon oxynitride film to have a higher dielectric constant, may have a physical film thickness as large as possible for a fixed, smaller electrical film thickness similarly to other high dielectric constant films. In this case, gate leakage current can be reduced without degrading the transistor characteristics in such an ultra thin film having a thickness of 3.0 nm or less.

Secondly, the nitrogen profile in the silicon oxynitride film can hardly be controlled. For example, when the control method described in Journal of Applied Physics, vol.84, page 2980 is employed, the use of a nitrogen monoxide gas prevents the nitrogen amount from being reduced at the silicon substrate interface. According to the nitriding method described in Material Research Society 1999, Spring Meeting, Abstract, page 84, a high pressure gas ambient at 25 atm., for example, is necessary to set the nitrogen position in the center of the film, which is not suitable for mass production type devices however. A high temperature, thermal nitriding reaction using a nitrogen monoxide gas and an oxygen gas is encountered, and therefore the control of the nitrogen position should be even harder.

Thirdly, the nitriding reaction is caused in the interface, which increases the roughness of the interface as the nitrogen amount increases. According to the method described in Japanese Patent Laid-Open Publication No. Hei. 6-140392 in particular, the roughness of the interface increases in the process of nitriding the oxide film.

SUMMARY OF THE INVENTION

The present invention is directed to a solution to the above described disadvantages. More specifically, it is an object of the present invention to provide a semiconductor device and a MIS device, which is capable of preventing impurity ions in an electrode adjacent to the insulating film from penetrating through the insulating film to degrade the opposite electrode or substrate, and thereby providing a semiconductor device or a MIS device having excellent transistor characteristics.

It is another object of the present invention to provide a method of manufacturing such a simiconductor device of a MIS device.

The present invention provides, in a first aspect thereof, a semiconductor device including an active element having a silicon oxynitride film including silicon nitride and silicon oxide as main components thereof, the silicon oxynitride film having a first specific dielectric constant which is larger than a second specific dielectric constant theoretically calculated from a weighted average of a specific dielectric constant of silicon oxide and a specific dielectric constant of silicon nitride, the weighted average being based on a weight ratio between the silicon nitride and the silicon oxide in the silicon oxynitride film.

The present invention provides, in a second aspect thereof, a method for forming a semiconductor device having a MIS transistor including the steps of:

forming source/drain/channel regions of the MIS transistor on a silicon substrate;

forming a silicon oxide film on the silicon substrate in association with the source/drain/channel regions by using active oxygen; and nitriding the silicon oxide film by using active nitrogen to form a silicon oxynitride film as a gate insulating film of the MIS transistor, the silicon oxide film forming step and the nitriding step being conducted continuously in a single chamber while controlling a pressure inside the single chamber and electric power so that the silicon oxynitride film has a specific dielectric constant which is larger than an expected specific dielectric constant theoretically calculated from an amount of the active nitrogen used.

The present invention provides, in a third aspect thereof, a method for forming a semiconductor device having a MIS transistor including the steps of:

forming source/drain/channel regions of the MIS transistor on a silicon substrate; and forming a silicon oxynitride film on the silicon substrate in association with the source/drain/channel regions by using active oxygen and active nitrogen;

the silicon oxynitride film forming step being conducted while controlling a pressure inside a chamber and electric power so that the silicon oxynitride film has a specific dielectric constant which is larger than an expected specific dielectric constant theoretically calculated from an amount of the active nitrogen used.

The present invention provides, in a fourth aspect thereof, a method for forming a semiconductor device having a MIS transistor including the steps of:

forming source/drain/channel regions of the MIS transistor on a silicon substrate;

forming a silicon nitride film on the silicon substrate in association with the source/drain/channel regions by using active nitrogen; and oxidizing the silicon nitride film by using active oxygen to form a silicon oxynitride film as a gate insulating film of the MIS transistor;

the silicon nitride film forming step and the oxidizing step being conducted continuously in a single chamber while controlling a pressure inside the single chamber and electric power so that the silicon oxynitride film has a specific dielectric constant which is larger than an expected specific dielectric constant theoretically calculated from an amount of the active nitrogen used.

In accordance with the semiconductor device of the present invention and the semiconductor device manufactured by the method of the present invention, the silicon oxynitride film has a larger specific dielectric constant, which is larger than the expected specific dielectric constant theoretically calculated from the composition of the oxynitride film. Thus, the silicon oxynitride film has a smaller physical thickness compared to the equivalent oxide-film thickness, and has a larger function for preventing impurities in the overlying layer or gate electrode of the MIS transistor from penetrating therethrough toward the underlying layer or the silicon substrate.

The term "equivalent oxide-film thickness" of a subject insulating film as used herein means the thickness of a specific silicon oxide film having an electric property (or capacitance characteristic) equivalent to the electric property of the subject insulating film. The electric property of a film is typically measured by a capacitance it affords when it is used as a capacitor insulator film. On the other hand, the physical thickness of the insulating film can be measured by an electron microscope or ellipsometer. The physical thickness is generally referred to as simply "thickness".

DETAILED DESCRIPTION OF THE PREFERRED EMBODIMENTS

Now, the present invention will be described with reference to accompanying drawings in connection with MIS devices according to preferred embodiments of the present invention. The present invention is devised based on the experiment results of evaluating MIS type FET transistors each having a gate insulating film made of silicon oxynitride and formed by a nitriding technique using active nitrogen.

Figure 10:
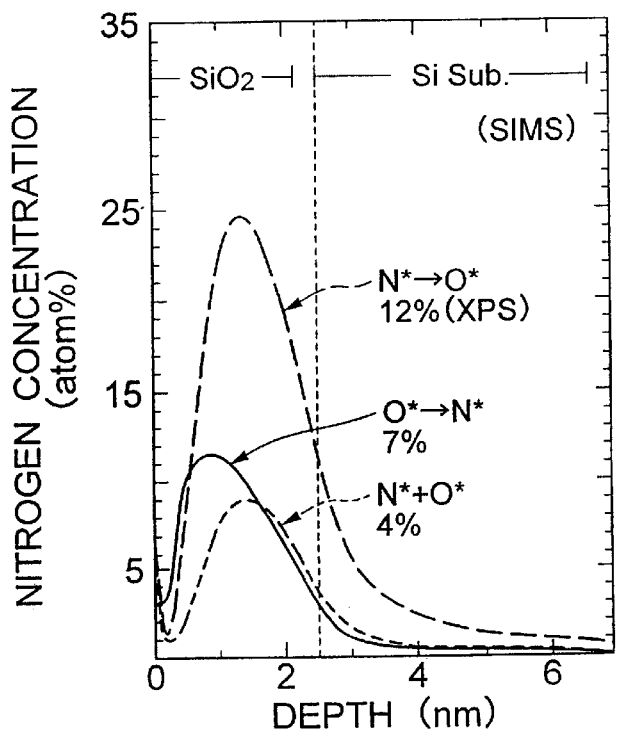
FIG. 10 is a graph representing nitrogen profiles in silicon oxynitride films formed using active oxygen and active nitrogen.

FIG. 10 is a graph representing SIMS profiles in silicon oxynitride films produced by various processes. The graph represents the nitrogen profiles of silicon oxynitride films formed by first to third radical processes. In the first radical process, active oxygen O* is first used followed by the use of active nitrogen N* (i.e., O*→N*). In the second radical process, active oxygen O* and active nitrogen N* are used at a time (i.e., N*+O*). In the third radical process, active nitrogen N* is first used followed by the use of active oxygen O* (i.e., N*→O*) The abscissa represents the depth as viewed in the thickness direction of a Si substrate, with the surface thereof in contact with the oxynitride film being the origin. The ordinate represents the nitrogen concentration. The broken line near the area at a depth of 2.4 nm represents the interface between the silicon oxynitride film and the silicon substrate. In the oxynitride films produced by these processes, the nitrogen concentrations obtained by XPS measurement are given in the graph.

In the first radical process, a ultra-high vacuum chamber is used, the sample temperature is set to 620° C., and radical nitriding is performed after radical oxidation. An oxygen gas as much a pressure as about $5 \times 10^{-1}$ Pa is introduced into the chamber, and a microwave is applied at 150 W for 240 seconds for treatment. Thus, an underlying oxide film can be formed to have a thickness of about 2.0 nm. Then, a nitrogen gas as much a pressure as about $5 \times 10^{-1}$ Pa is introduced, and a microwave is applied at 150 W for 600 seconds for treatment. Thus, a nitriding reaction is produced from the side of the oxide film surface, and an oxynitride film having nitrogen localized on the oxide film surface side can be formed.

In the second radical process, the sample temperature in the ultra-high vacuum chamber is set to 620° C., and an oxygen gas and a nitrogen gas are simultaneously introduced into the chamber in the ratio of 1:1 and each about in a partial pressure of $1 \times 10^{-1}$ Pa. A microwave is applied at 150 W for 300 seconds for treatment. In these conditions, the silicon oxynitride film about as thick as 2.0 nm may be formed. Thus, an oxynitride film having nitrogen localized in the vicinity of the center can be formed.

In the third radical process, the sample temperature in the ultra-high vacuum chamber is set to 620° C., a nitrogen gas as much a pressure as about $1 \times 10^{-1}$ Pa is introduced, and a microwave is applied at 150 W for 300 seconds for treatment. Thus, a silicon nitride film to be an underlying layer can be formed to have a thickness of about 2.0 nm. Then, an oxygen gas as much a pressure as about $1 \times 10^{-1}$ Pa is introduced, and a microwave is applied at 150 W for 600 seconds. Thus, an oxidizing reaction is produced on the side of the nitride film, and an oxynitride film having nitrogen localized on the substrate interface side can be formed.

As can be seen from FIG. 10, the nitrogen position is localized in the vicinity of the surface in the first radical process in which the radical oxidizing is followed by the radical nitriding. In the third radical process in which the radical nitriding is followed by the radical oxidizing, the nitrogen position is localized in the vicinity of the interface denoted by the broken line. These exhibit that oxidizing and nitriding reactions using radicals are mainly produced on the surface side.

The nitrogen position control according to the conventional method takes advantage of reactions caused at the interface by oxidizing and nitriding species diffusing within the film. The nitrogen position control according to the present invention utilizes reactions at the surface, and thus, a nitrogen profile can readily be controlled in a shallow region at a depth of 3.0 nm or less. The structure having nitrogen localized especially on the surface side can be formed without causing a nitriding reaction at the interface. As a result, superior interface electric characteristics of the oxide film can be maintained.

Then, a combination with a High-k film (high dielectric constant film) will be now described A silicon oxynitride film produced by the manufacturing method according to an embodiment of the present invention is used as an underlying film for a High-k film (a metal oxide such as oxide of Zr, HF, La, Ti, Ta, Y, La, or Al). A silicon oxide film is used as an underlying film according to a conventional method, wherein the dielectric constant of such a silicon oxide film is as low as 3.9 which has been a great hindrance in reducing film thickness.

In the silicon oxynitride film produced by the manufacturing method according to an embodiment of the present invention, a dielectric constant of 5 to 7 results. A combination with a high dielectric constant, High-k film, the film thickness can be reduced. When a FET is produced using a silicon oxynitride film according to an embodiment of the present invention and a High-k film, interface electric characteristics equivalent to the conventional oxide film result. The nitrogen localized on the oxynitride film surface side prevents the metal used as the High-k material from diffusing to the silicon substrate side, and therefore a reaction between the metal and oxygen at the High-k/silicon oxynitride film interface can be restrained.

In order to obtain superior electric characteristics for a transistor, the nitrogen peak should be separated from both the surfaces of the silicon oxynitride film and the silicon substrate (Si-Sub). The nitrogen peak in the silicon oxynitride film formed by the first radical process (O*→N*) is on the surface side of the silicon oxide film as described above. Thus, the optimum state for the gate insulating film results. More specifically, the silicon oxide film is formed using active oxygen O* and then the silicon oxide film is nitrided using active nitrogen N*, whereby the nitrogen can be distributed at the surface of the silicon oxynitride film and in the vicinity thereof. This is because the nitriding using active nitrogen proceeds on the surface of the silicon oxide film.

The nitrogen peak in the oxynitride film formed by the second radical process (O*+N*) is positioned near the interface between the silicon oxynitride film and the silicon substrate as described above. This position is denoted by the broken line in FIG. 10. More specifically, in the silicon oxynitride film formed using active oxygen O* and active nitrogen N* simultaneously, the nitrogen is positioned substantially in the center of the oxynitride film, which would hardly be optimum for obtaining superior transistor characteristics.

The nitrogen peak in the oxynitride film formed by the third radical process (N*→O*) is positioned near the interface between the silicon oxynitride film and the silicon substrate as described above. More specifically, after a silicon nitride film is formed using active nitrogen N*, a silicon oxynitride film is formed using active oxygen O*, and therefore a distribution having much nitrogen at the silicon substrate interface results, which again would hardly be optimum for obtaining superior transistor characteristics.

A process of forming a silicon oxynitride film according to the present invention will be described hereinafter in detail. A cleaned and dried silicon substrate is introduced into a filming unit for forming an UHV-oxynitride film (ultra-high vacuum chamber: see FIG. 6). By using the filming unit, in the maintained atmosphere of $1 \times 10^{-6}$ Pa ($1 \times 10^{-8}$ Torr) or less, the silicon substrate is thermally treated at 920° C. for five minutes for cleaning the substrate surface.

Then, a silicon oxide film is formed on the silicon substrate in an atmosphere of an oxygen gas, a mixed atmosphere of an oxygen gas and a hydrogen gas or an atmosphere of active oxygen. After the silicon oxide film is formed, the filming temperature is set to 750° C. (620° C. at the substrate). The nitrogen gas flow rate is set to 0.25 sccm, the pressure in the treatment chamber (the pressure of active species) in forming the film is set to $5 \times 10^{-1}$ Pa, and the microwave power of an ECR device supplying active nitrogen is set to 150 watts. In these conditions, the silicon oxide film is nitrided for 5 to 30 minutes to form a silicon oxynitride film. The step of forming the silicon oxide film and the step of forming the silicon oxynitride film are performed sequentially in the same ultra-high vacuum chamber. Then, an ordinary process of forming a gate electrode and an ordinary process of forming source/drain/channel regions are performed to complete the MOS device as one of the MIS devices.

Figure 11:
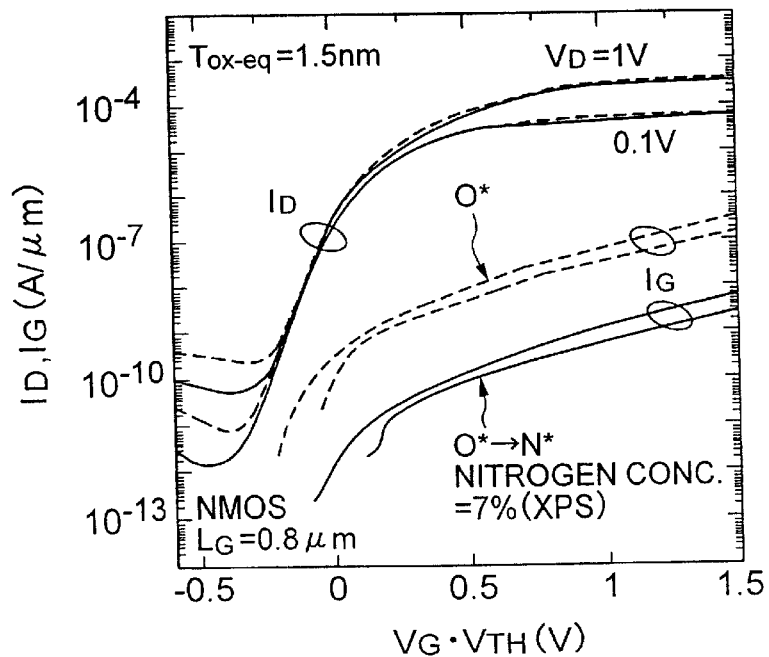
FIG. 11 is a graph representing the relation between the gate current and the drain current in MOS transistors using silicon oxynitride films according to the present invention and a conventional silicon oxynitride film.

A MOS transistor formed by the above method and having a gate insulating film as thick as 1.5 nm was examined for the transistor characteristics. FIG. 11 is a graph representing drain current and gate leakage current in the conventional silicon oxynitride film and the silicon oxynitride films formed by the above nitriding methods. The abscissa represents gate voltage $V_G$-$V_{TH}$ normalized by a threshold voltage, and the ordinate represents drain current $I_D$ and gate current $I_G$ In the graph, the solid line represents the characteristic of the silicon oxynitride film formed by the first radical process (O*→N*), and the broken line represents the characteristic of the silicon oxide film formed using active oxygen O*. As can be seen from the graph, the silicon oxynitride film has the same drain current as that of the silicon oxide film, while its gate leakage current is smaller by one to two orders of magnitude. More specifically, in the manufacture of the silicon oxynitride film by the first radical process, a silicon oxide film is formed on a silicon substrate and then the oxide film is nitrided with active nitrogen N* and formed into the silicon oxynitride film. As a result, the gate leakage current is significantly reduced as compared with the conventional silicon oxide film.

Then, the specific dielectric constant of the silicon oxynitride film thus formed was measured. Physical film thickness is measured using an electron microscope. Electrical thickness could not be measured by the general MOS capacitance method because the leakage current was too large. Therefore, the electrical thickness was measured based on the relation between the threshold voltage of the MOS transistor and the substrate voltage, wherein the measurement was unaffected by the leakage current.

The measuring method has been proposed as a method of evaluating a gate insulating film by the applicant (Japanese Patent Application No. Hei. 11-364206). The method addresses the inability of calculating physical film thickness for a thin oxide film relative to the equivalent in the thickness of the oxide film (referred to as equivalent oxide-film thickness) because of large gate leakage current of the thin oxide film. According to the evaluation method, a field effect transistor having a thick silicon oxide film as a gate insulating film and a field effect transistor having a gate insulating film to be evaluated are formed at the same time. Thus, the field effect transistor having the thick silicon oxide film in known film quality and known film thickness is used as a gate insulating film. By using this technique, impediment factors to calculation of the thickness of the gate insulating film (parasitic film thickness) or the channel concentration resulting from depletion in the impurities in the gate electrode can stably be obtained. In this technique, even if the gate insulating film to be evaluated has a complicated structure or even if the thickness is not known, the electrical and physical gate insulating film thicknesses can be obtained.

Figure 12:
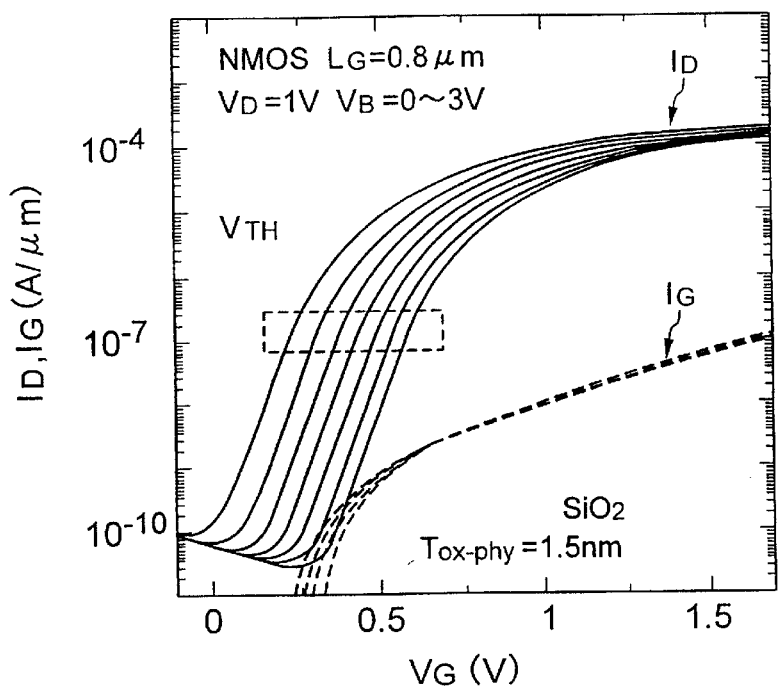
FIG. 12 is a graph representing the relation between the drain current, the gate voltage, and the gate current as the substrate voltage changes in a MOS transistor.

Therefore, the electrical thickness can be produced even if the thickness of the gate insulating film is not known or even if the gate insulating film has large gate leakage current. Thus, the interface state, the thickness of the gate insulating film and the mobility at the region including the interface between the gate insulating film and the silicon substrate can be produced according to the following expressions (1) and (2):

$$S=(kT/q)\ln\{10(1+(C_D+C_{it})/C_{OX})\} \quad (1)$$

where S is the subthreshold coefficient, k is the Boltzmann constant, T is the temperature, q is the elementary electric charge, $C_D$ is the depletion layer capacitance, $C_{it}$ is the equivalent capacitance in the interface state, and $C_{OX}$ is the silicon oxide film capacitance, and $$\mu_{eff}(dI_D/dV_D)(L/W)/(C_{OX}(V_G-V_{th})) \quad (2)$$

where $\mu_{eff}$ is the effective mobility, $I_D$ is the drain current, $V_D$ is the drain voltage, L is the gate electrode length, W is the gate electrode width, $C_{OX}$ is the silicon oxide film capacitance, $V_G$ is the gate voltage, and $V_{TH}$ is the threshold voltage. Thus, the equivalent oxide-film thickness can be introduced based on the substrate voltage dependence of the threshold voltage of the MOS transistor FIG. 12 is a graph representing the dependence of the drain current $I_D$ and the gate current $I_G$ on the gate voltage $V_G$ as the substrate voltage $V_B$ is changed. The abscissa represents the gate voltage $V_G$, while the ordinate represents the drain current $I_D$ and the gate current $I_G$. In the graph, the drain current is larger than the gate current by two orders of magnitude in the vicinity of the threshold voltage $V_{TH}$ and therefore the process of obtaining the threshold voltage used for calculation of the equivalent oxide-film thickness is unaffected by the gate current.

More specifically, as can be understood from the graph, a value corresponding to the range of the gate voltage $V_G$ from 0.2V to 0.5V is used as the threshold voltage $V_{TH}$, and the gate current $I_G$ in the range is smaller than the drain current $I_D$ by about two orders of magnitude, and therefore the threshold voltage $V_{TH}$ is little affected. In general, the dependence of the threshold voltage $V_{TH}$ on the substrate voltage $V_B$ can be represented by the following expression (3):

$$V_{TH}=((2\epsilon_s\epsilon_0 qN_{ct})_{1/2}/C_{OX})(V_B+2\phi_F)^{1/2}+V_{FB}+2\phi_F \quad (3)$$

where $N_{ch}$ is the impurity concentration of the channel, $C_{OX}$ is the capacitance value of the gate insulating film including the electrical thickness $T_{OX-ele}$, $\epsilon_s\epsilon_0$ is the specific dielectric constant of silicon, q is the elementary electric charge, $\phi_F$ is the Fermi level, and $V_{FB}$ is the flat-band voltage.

Figure 13:
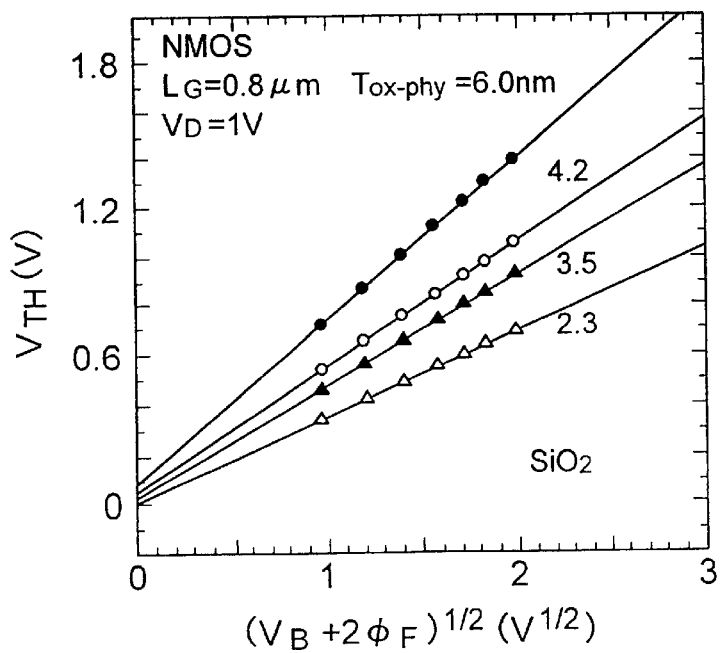
FIG. 13 is a graph representing the substrate voltage and the threshold voltage in a MOS transistor for obtaining an electrical thickness.

FIG. 13 is a graph representing the dependence of the transistor threshold voltage $V_{TH}$ on the substrate voltage $V_B$ when the gate insulating film is an oxide film. The abscissa represents (substrate voltage+2×Fermi level)$^{1/2}$, and the ordinate represents the threshold voltage. In the graph, the channel concentration $N_{CH}$ and the equivalent oxide-film thickness (oxide film capacitance $C_{OX}$) can be obtained based on the inclination of the straight line from the expression (3).

In the graph, in the thick gate oxide film formed by the same process as the thin gate oxide film, the physical film thickness $T_{OX-phy}$ is the same as the equivalent oxide-film thickness $T_{OX-eq^*}$. Therefore, the parasitic thickness $T_{OX-para}$ by depletion of the gate electrode or quantization of the channel can be obtained. More specifically, the following expression is established:

$$T_{OX-ele}=T_{OX-eq}+T_{OX-para}.$$

Finally, the equivalent oxide-film thickness of the thin oxide film is obtained from the following expression:

$$T_{OX-eq}=T_{OX-ele}-T_{OX-para}.$$

Figure 14:
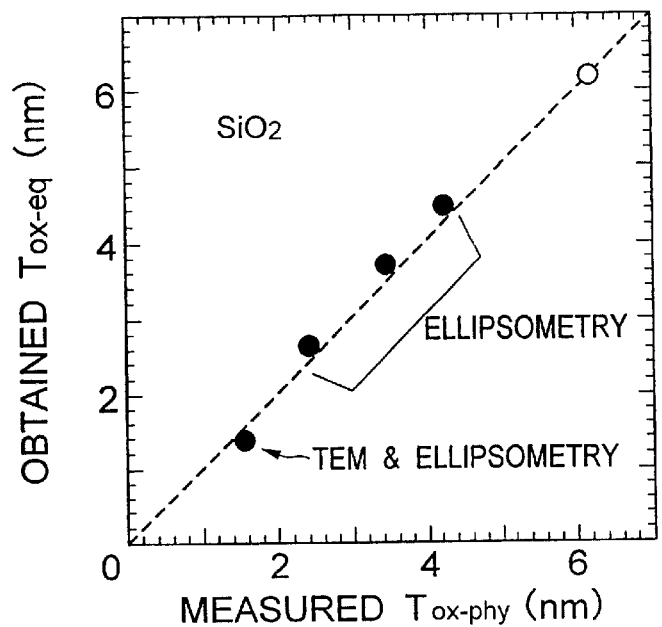
FIG. 14 is a graph representing a result of comparison between an equivalent oxide-film thickness produced based on MOS transistor characteristics and an equivalent oxide film thickness produced by physical measurement or optical measurement.

FIG. 14 is a graph showing the relation between the equivalent oxide-film thickness $T_{OX-eq}$ (on the ordinate) obtained from the substrate voltage dependence of the threshold voltage (from the expression (3)) in the transistor and the physical film thickness $T_{OX-phy}$ (on the abscissa) obtained by the thickness measuring device (section TEM and an ellipsometer).

When the inclination of the straight line in the graph changes by 10%, the obtained equivalent oxide-film thickness changes by 3%. If the channel concentration changes by 10%, the equivalent oxide-film thickness changes by 5%. When the inclination of the straight line and the channel concentration both change by 10%, the equivalent oxide-film thickness changes by 8%. The error is within 0.11 nm for a thickness of 1.5 nm. Thus, the method of producing the equivalent oxide-film thickness from the electric characteristics of the transistor is highly precise in a thin region. The error for the equivalent oxide-film thickness may result from the extraction of the inclination of the straight line or the channel concentration. The thickness obtained from the expression (3) is substantially the same as that obtained by the thickness measuring device obtained from the expression (3). Therefore, the thickness measuring method using the expression (3) is clearly suitable.

The results of the physical film thickness and the equivalent oxide-film thickness obtained by the measuring method are given in the Table 1.

TABLE 1

| Filming process | Nitrogen concentration in oxide film (XPS) | Physical film thickness/ Equivalent oxide-film thickness | Specific dielectric constant |
|---|---|---|---|
| O*→N* | 7% | 2.5/1.5 nm | 6.5 |
| O*+N* | 4% | 2.5/1.6 nm | 6.1 |
| N*→O* | 12% | 2.5/1.9 nm | 5.1 |
| O* | 0% | 1.5/1.5 nm | 3.9 |

As shown in the Table 1, the silicon oxynitride film formed by the first radical process (O*→N*) has a nitrogen concentration (XPS) of 7% in the film, the physical film thickness and the equivalent oxide-film thickness relative to the physical film thickness are 2.5 nm and 1.5 nm, respectively. The specific dielectric constant is 6.5. The silicon oxynitride film formed by the second radical process (O*+N*) has a nitrogen concentration of 4% in the film, and the physical film thickness and the equivalent oxide thickness relative to the physical film thickness are 2.5 nm and 1.6 nm, respectively. The specific dielectric constant is 6.1.

The silicon oxynitride film formed by the third radical process (N*→O*) has a nitrogen concentration of 12% in the film, and the physical film thickness and the equivalent oxide-film thickness are 2.5 nm and 1.9 nm, respectively. The specific dielectric constant is 5.1. The silicon oxide film formed using only active oxygen O* has a nitrogen concentration of 0% in the film, and the physical film thickness and the equivalent oxide-film thickness are both 1.5 nm. The specific dielectric constant is 3.9.

As can be seen from the Table 1, at least the specific dielectric constants of the silicon oxynitride films produced by the first and second radical processes are not less than 6.0, which is higher than that of the general silicon oxynitride film expected from the amount of nitrogen introduced. In the silicon oxynitride film having a nitrogen concentration (XPS) in the oxide film in the range from 5% to 10%, the value is close to that of a general silicon nitride film. The physical film thickness is about 1.5 times as large as the equivalent oxide-film thickness. Therefore, as can be understood, if the physical film thickness relative to the equivalent of 1 nm to 3 nm in the thickness of the silicon oxide film for example is increased in the range from 1.5 to 4.5 nm, the gate leakage current can effectively be reduced, while superior transistor characteristics are maintained.

Meanwhile, there is an article about the dielectric constant of thick silicon oxynitride films in Journal of Electrochemical Society (J. Electrochem. Soc.), 1968, vol. 115, pp.311–317. According to the article, at a substrate temperature in the range from 750° C. to 1100° C., using a silane gas and an ammonia gas, a silicon nitride film is formed to have a thickness of 150 nm. At the same substrate temperature, using a silane gas, an ammonia gas and a nitrogen monoxide gas, a silicon oxynitride film is also formed to have a thickness of 150 nm. The specific dielectric constant of the manufactured silicon oxynitride film is obtained based on the MOS capacitance method and the physical film thickness. According to the description, the specific dielectric constant is produced by a monotonous primary linear interpolation between the specific dielectric constant of the silicon oxide film and the specific dielectric constant of the silicon nitride film.

Figure 15:
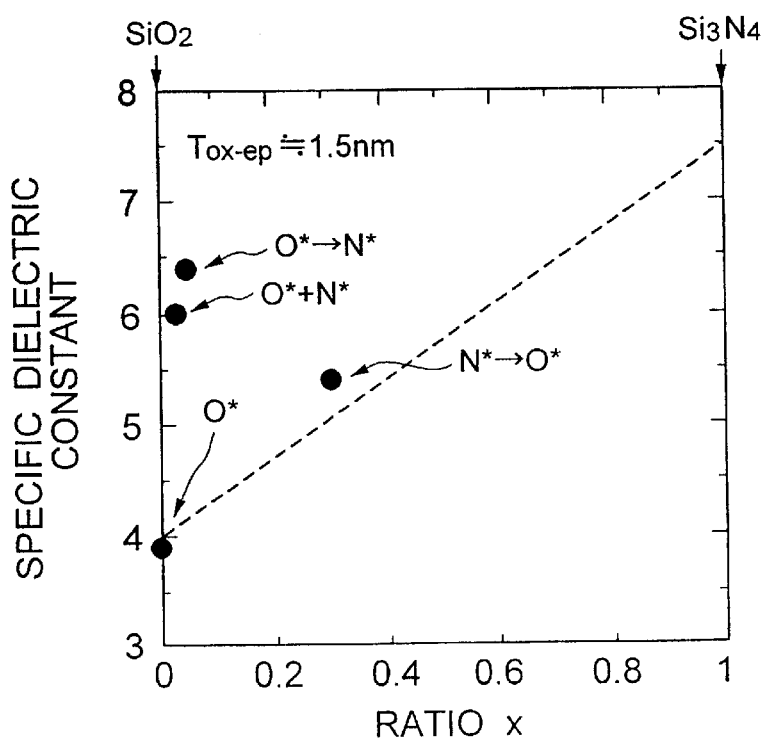
FIG. 15 is a graph representing the specific dielectric constant for a silicon oxynitride film as thick as 1.5 nm.

FIG. 15 is a graph representing the specific dielectric constant for a silicon oxynitride film as thick as 1.5 nm. The abscissa represents the ratio of a silicon nitride film in a mixed film including a silicon oxide film and the silicon nitride film, in other words, the composition ratio x of the silicon nitride in the silicon oxynitride film. The ordinate represents the specific dielectric constant.

In the graph, the silicon oxide film formed using only active oxygen O* has the same specific dielectric constant as that of the conventional oxide film. On the other hand, the silicon oxynitride films formed by the first radical process (O*→N*) and the second radical process (O*+N*) have values extremely higher than what is expected from the general silicon oxynitride film (denoted by the broken line).

In the graph in FIG. 15, the silicon oxynitride film having silicon nitride in the composition ratio x of 0.05 to 0.5, and a specific dielectric constant of at least 4.5 and less than 6.0 is formed by the third radical process (N*→O*). The dielectric constant of the silicon oxynitride film is a value expected from a general silicon oxide film. The silicon oxynitride film allows the general transistor characteristics and the gate leakage current characteristic to be provided. Meanwhile, the reliability of the silicon oxynitride film by nitrogen in the vicinity of the interface is slightly lower.

A silicon oxynitride film having silicon nitride in the composition ratio x of 0.05 to 0.45 and a specific dielectric constant of at least 6.0 and less than 6.5 is formed by the second radical process (O*+N*). The specific dielectric constant of the silicon oxynitride film is a value extremely higher than what is expected from the general silicon oxide film. Using the silicon oxynitride film, general transistor characteristics and general gate leakage current characteristic result, and the reliability of the silicon oxynitride film by the nitrogen in the vicinity of the interface is slightly lower.

A silicon oxynitride film having silicon nitride in the composition ratio x of 0.05 to 0.4 and a specific dielectric constant of at least 6.5 and less than 7.5 is formed by the first radical process (O*→N*). In this case, an insulating film of a silicon oxynitride film having a reduced thickness and a high specific dielectric constant can be provided, wherein the nitrogen does not reach the interface between the insulating film and the adjacent substrate. As a result, the film is preferable in improving the transistor characteristics. The gate leakage current can be reduced and high reliability as a silicon oxynitride film results. The specific dielectric constant of the silicon oxynitride film is set to less than 7.5, because in levels beyond 7.5, the entire region in the depth-wise direction in the insulating film is nitrided, the gate insulating film on the silicon substrate side is not oxidized and the transistor characteristics can be degraded.

Figure 16:
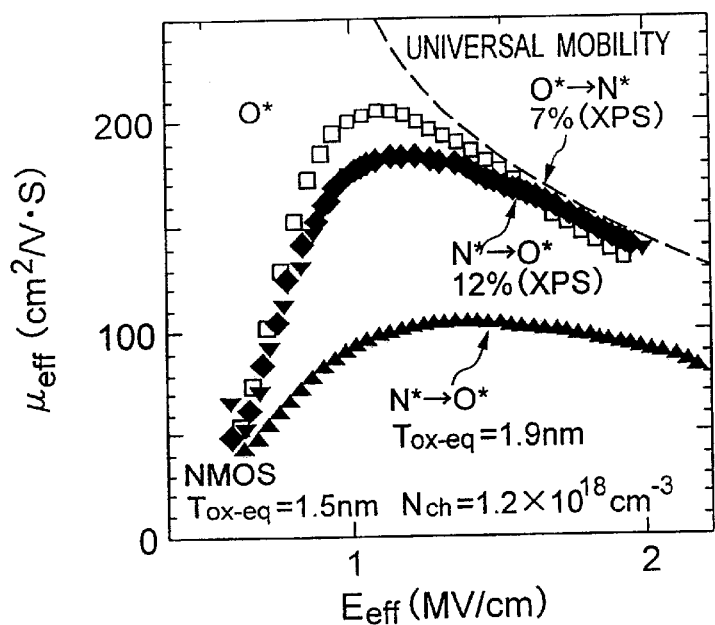
FIG. 16 is a graph representing in comparison the electron mobility obtained from MOS transistors having silicon oxynitride films formed as gate insulating films.

FIG. 16 is a graph showing in comparison the electron mobility produced from MOS transistors having silicon oxynitride films formed by various methods as gate insulating films. More specifically, the effective mobility in the silicon oxynitride films formed by the first to third radical processes and the silicon oxide film formed using only active oxygen O* are shown. The abscissa represents an effective electric field (MV/cm) and the ordinate represents the effective mobility ($cm^2$/Vs).

As can be observed from the graph, the electron mobility is substantially equal between in the silicon oxide film and in the silicon oxynitride film formed in the nitriding process following the oxidizing process. The drain current of the produced NMOS transistor is substantially equal between for the silicon oxide film and for the silicon oxynitride films except for the silicon oxynitride film formed in the oxidizing process after the nitriding (see FIG. 15).

The oxynitride film formed by the third radical process (N*→O*) has its nitrogen peak positioned at the interface between the silicon oxynitride film and the silicon substrate, and therefore the effective mobility is small. Meanwhile, the silicon oxynitride films formed by the first and second radical processes (O*→N*, O*+N*) have their nitrogen peaks positioned away from the interface between the silicon oxynitride film and the silicon substrate. Therefore, the effective mobility is larger than that of the silicon oxynitride film formed by the third radical process (N*→O*). It is to be noted, however, that since there is some nitrogen at the interface between the silicon oxynitride film and the silicon substrate, the maximum value is smaller than the effective mobility of the oxide film (O*) free from nitrogen. The power supply voltage at an effective electric field of 1.5 MV/cm is used in practice, and the effective mobility of each of the silicon oxynitride films formed in the first and second radical processes (O*→N*, O*+N*) is similar to that of the oxide film (O*). Therefore, the drain current is also substantially equal.

Figure 17:
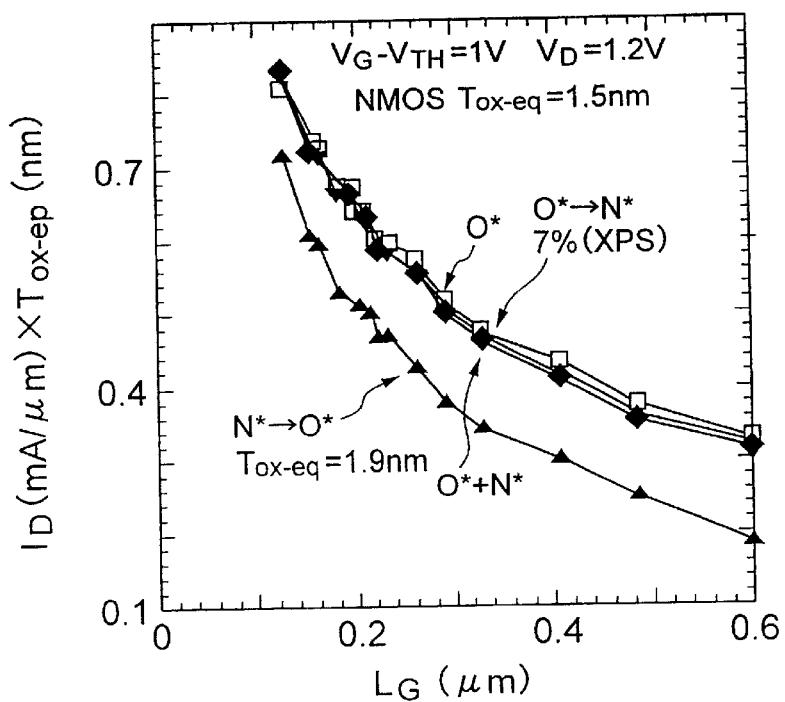
FIG. 17 is a graph representing in comparison the drain current in MOS transistors having silicon oxynitride films formed as gate insulating films.

FIG. 17 is a graph showing in comparison the drain current in the MOS transistors having gate insulating films of silicon oxynitride films formed by various methods. More specifically, the drain current for each of the silicon oxynitride films formed by the first to third radical processes and the drain current for the silicon oxide film formed using only active oxygen O* are shown. The abscissa represents the gate electrode length (microm), while the ordinate represents the drain current $I_D$ (mA/microm) and the equivalent oxide-film thickness $T_{ox-cq}$(nm).

The silicon oxynitride film formed by the third radical process (N*→O*) has a nitrogen peak at the interface between the oxynitride film and the silicon substrate, and the drain current is small. On the other hand, the silicon oxynitride films formed by the first and second radical processes (O*→N*, O*+N*) have their nitrogen peaks away from the interface between the oxynitride film and the silicon substrate. The drain current for the oxide film O* free from nitrogen is substantially equal.

As can be understood from the graph in FIG. 17 and the Table 1, the silicon oxynitride film formed by the first radical process (O*→N*) according to which the silicon substrate surface is oxidized followed by nitriding has an increased nitrogen content in the film. gate leakage current is reduced for the equivalent oxide-film thickness in the Table 1 at a fixed value. It has been confirmed that the MOS transistor having the silicon oxynitride film operates normally.

Figure 18:
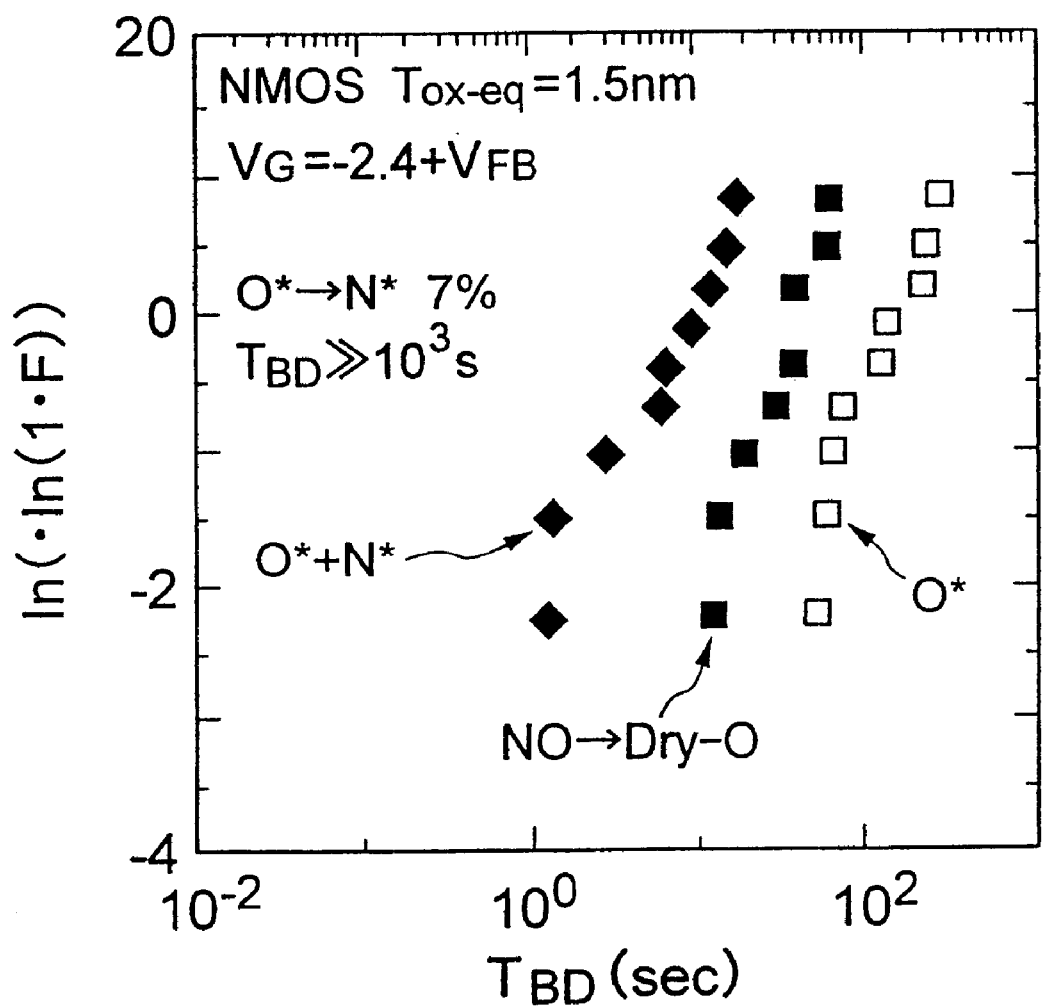
FIG. 18 is a graph showing in comparison the insulation breakdown reliability of silicon oxynitride films in MOS transistors having the silicon nitride films as gate insulating films.

FIG. 18 shows in comparison the insulation breakdown reliability of the silicon oxynitride films obtained from the MOS transistors having the silicon nitride films formed by various methods as gate insulating films. More specifically, FIG. 18 shows the insulation breakdown reliability in the silicon oxynitride films formed by the first and second radical processes, the silicon oxide film formed using only active oxygen O*, and the oxynitride film formed by the conventional method (NO→Dry→O) The abscissa represents time (sec.) before the insulation breakdown, and the ordinate represents the cumulative frequency distribution (Weibull plot) of the samples that are broken down in the insulation.

The silicon oxynitride film formed by the first radical process (O*→N*) has particularly high reliability, and is not broken down after 1000 seconds or longer. As can be observed from FIG. 18, the silicon oxynitride film formed by the first radical process (O*→N*) produced in the process of oxidizing the silicon substrate followed by nitriding has insulation breakdown reliability 100 times or more as high as that of the conventional oxide film.

Thus, the silicon oxynitride films formed by the manufacturing method according to the present invention have a higher dielectric constant than that of the conventional oxide film produced by thermal nitriding for a fixed equivalent oxide-film thickness. Therefore, it will be understood that the gate leakage current can be reduced effectively.

According to the present invention, the gate insulating film includes a silicon oxynitride film with a specific dielectric constant larger than a specific dielectric constant produced by simply averaging the specific dielectric constants of silicon oxide and silicon nitride by the composition ratios. Specifically, according to the present invention, a value greater than the value represented by the following expression (4):

$$(1 \times x) \times 3.9 + x \times 7.5 \qquad (4)$$

results for the specific dielectric constant $\epsilon$, wherein the specific dielectric constant of the silicon oxynitride film is $\epsilon_\epsilon$, the specific dielectric constant of silicon oxide is 3.9, and the specific dielectric constant of silicon nitride is 7.5, and the composition ratio of the silicon nitride in the silicon oxynitride film is x. The use of the silicon oxynitride film having the above characteristics, the penetration of impurity ions from an adjacent gate electrode through the ultra thin gate insulating film to affect a silicon substrate on the opposite side can surely be restrained.

Figure 1:
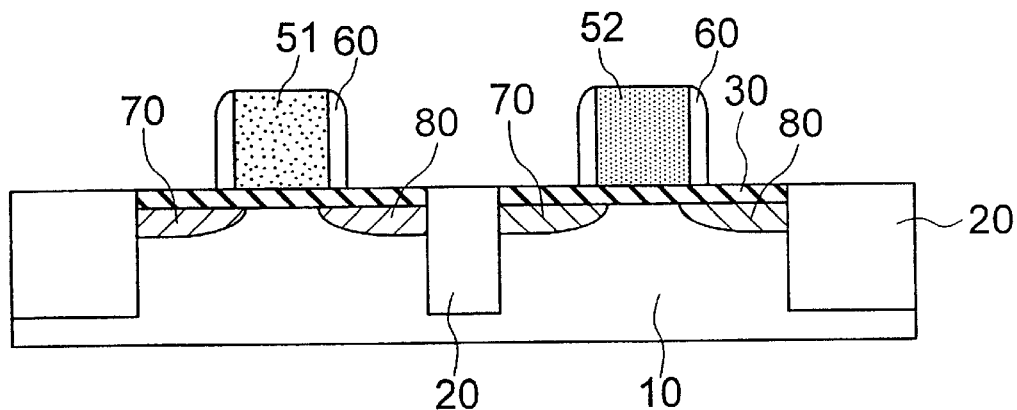
FIG. 1 is a schematic sectional view showing a MOS transistor according to a first embodiment of the present invention.

Referring to the accompanying drawings, embodiments of the present invention will be now described in detail. FIG. 1 is a sectional view of the general structure of a MOS transistor according to a first embodiment of the present invention.

Adjacent MOS transistors isolated from each other by an element isolation region 20 each includes, on a silicon substrate 10, an element region, a gate electrode 51 (52), and a gate sidewall insulating film 60. The element region includes a source region 70 and a drain region 80 adjacent to each other with a channel therebetween. The gate electrode 51 (52) is formed on the channel region with a gate insulating film 30 therebetween. The gate sidewall insulating film 60 covers each sidewall of the gate electrode 51 (52).

The MOS transistor has the gate insulating film 30 on the silicon substrate 10. The gate insulating film 30 is a silicon oxynitride film formed on the silicon substrate 10 by the following process. Specifically, a silicon oxide film having a thickness in the range from 1 nm to 3 nm is formed on the silicon substrate 10. The silicon oxide film is then formed into a silicon oxynitride film having a thickness from 1 nm to 3 nm by nitriding using active nitrogen at a temperature in the range from 300° C. to 900° C. The silicon oxynitride film is formed by the first radical process (O*→N*), and the nitrogen concentration distribution in the film has a peak on the side of the oxynitride film surface as described in conjunction with FIG. 10. Using the surface reaction with the active nitrogen species as described above, the concentration distribution of the nitrogen in the oxynitride film is controlled.

It is to be noted that the thickness of the oxynitride film should be in the range from 1 nm to 3 nm. This is because nitriding with active nitrogen cannot be effectively controlled within the oxynitride film for a thickness not more than 1 nm, whereby the silicon substrate could be nitrided, which increases the roughness of the interface between the oxynitride film and the silicon substrate and would impair the transistor characteristics. On the other hand, for a thickness greater than 3 nm, the resulting film is no longer advantageous over the conventional silicon oxide film in connection with the impurity penetration or tunneling leakage current.

Figure 2:
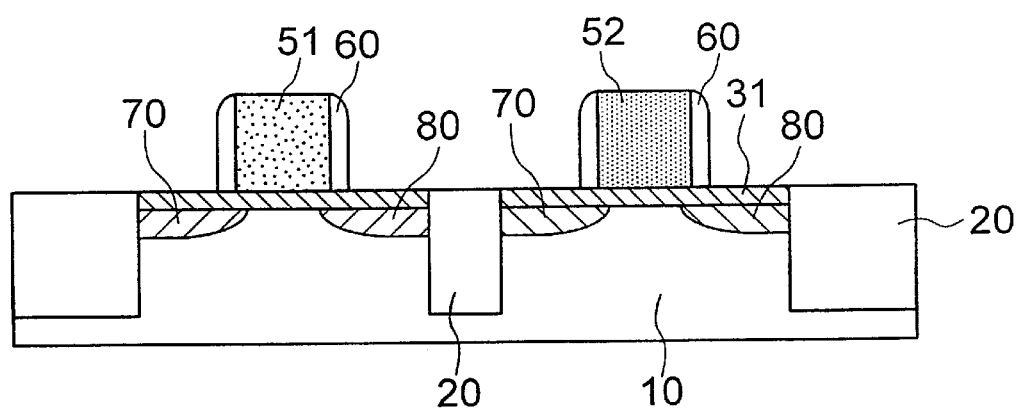
FIG. 2 is a schematic sectional view showing a MOS transistor according to a second embodiment of the present invention.

A MOS transistor according to a second embodiment of the present invention will be now described in conjunction with FIG. 2. The MOS transistor includes a silicon oxynitride film as an insulating film 31. The silicon oxynitride film is formed by the following process. A silicon oxide film having a thickness in the range from 1 nm to 3 nm is formed on the substrate 10. The silicon oxide film is then nitrided at a temperature in the range from 300° C. to 900° C. using active nitrogen, so that the silicon oxynitride film having a nitrogen concentration from 3% to 10% results. The silicon oxynitride film is therefore formed by the first radical process (O*→N*). The other members and structures in this embodiment are similar to those of the MOS transistor shown in FIG. 1.

It is to be noted that the nitrogen concentration should be in the range from 3% to 10%. This is because the gate leakage current cannot be effectively reduced, as shown in FIG. 11, for a nitrogen concentration less than 3%. For a nitrogen concentration greater than 10%, the nitrogen in the oxynitride film reaches the silicon substrate, whereby the roughness of the interface between the oxynitride film and the silicon substrate increases, and accordingly the carrier mobility in the silicon substrate is reduced. This may deteriorate the transistor characteristics.

Figure 3:
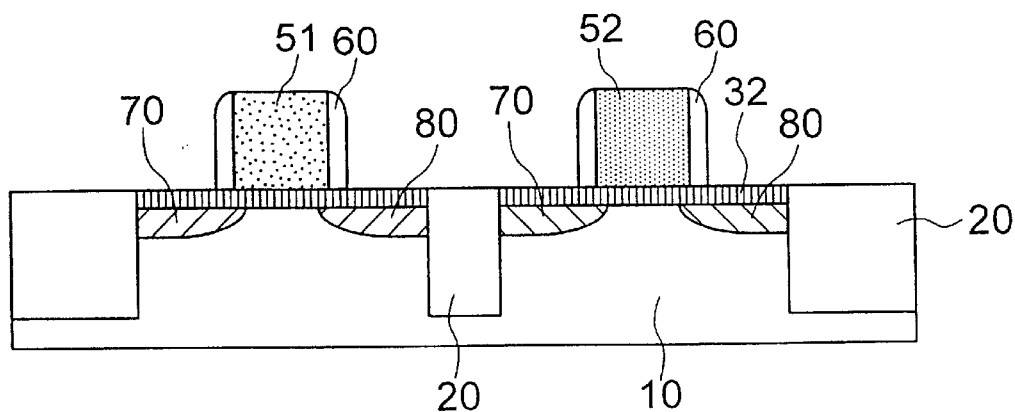
FIG. 3 is a schematic sectional view showing a MOS transistor according to a third embodiment of the present invention.

A MOS transistor according to a third embodiment of the present invention will be now described in conjunction with FIG. 3. The MOS transistor includes a silicon oxynitride film formed by the following process as a gate insulating film 32. A silicon oxide film having a thickness in the range from 1 nm to 3 nm is formed on a silicon substrate 10. The silicon oxide film is then nitrided at a temperature in the range from 300° C. to 900° C. using active nitrogen. More specifically, the silicon oxynitride film is also formed by the first process (O*→N*), and the nitrogen peak in the film is within 1 nm from the surface and positioned more on the surface side than the central part of the film. The other members and structures of the embodiment are similar to those of the MOS transistor in FIG. 1.

Figure 4:
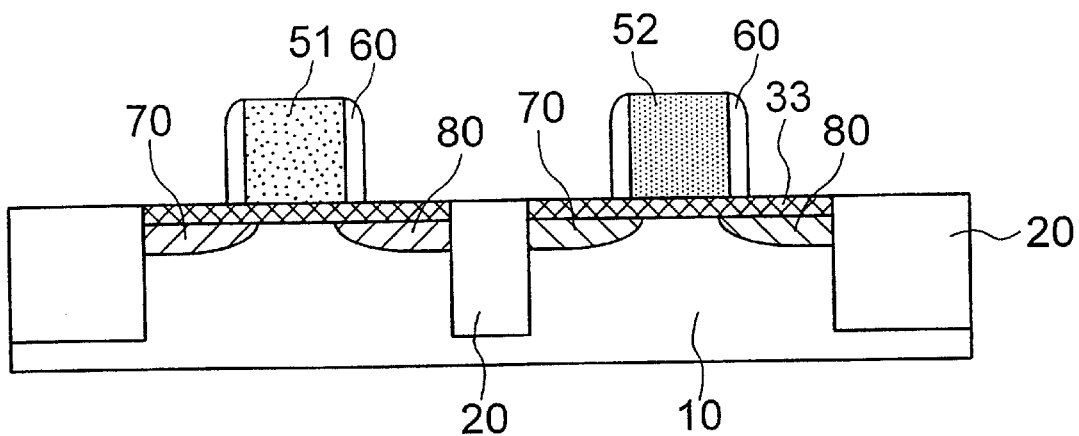
FIG. 4 is a schematic sectional view showing a MOS transistor according to a fourth embodiment of the present invention.

It is to be noted that the nitrogen distribution in the film should be within 1 nm from the surface, and that the maximum nitrogen concentration position is more on the surface side than the central part of the film. This is because, if the thickness of the oxynitride film is in the range from 1 nm to 3 nm, nitrogen is not introduced into the silicon substrate at least in the nitriding process of the silicon oxide film using active nitrogen, and a corresponding nitrogen profile results. The nitrogen, if introduced into the silicon substrate, degrades the carrier mobility, which degrades the transistor characteristics A MOS transistor according to a fourth embodiment of the present invention will be now described in conjunction with FIG. 4. The MOS transistor includes a silicon oxynitride film formed by the following process as a gate insulating film 33. A silicon oxide film having a thickness of 1 nm to 3 nm is formed on a silicon substrate 10. Then, the silicon oxide film is nitrided using active nitrogen at a temperature in the range from 300° C. to 900° C. The resulting silicon oxynitride film has a specific dielectric constant of at least 6.0.

It is to be noted that the specific dielectric constant is at least 6.0. This is because the physical film thickness is about 1.5 times as large as that of the general silicon oxide film (see Table 1) for a silicon oxynitride film thickness from 1 nm to 3 nm. This reduces the gate leakage current at least by one order of magnitude.

Figure 5:
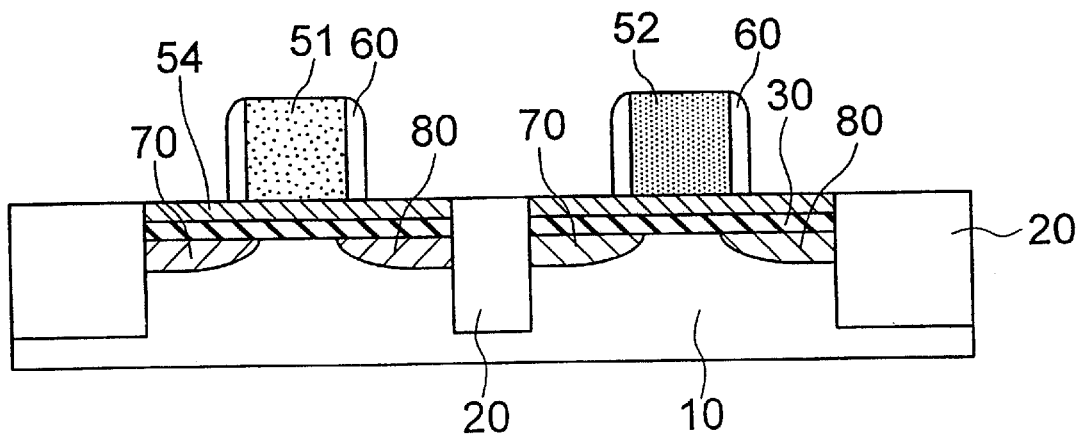
FIG. 5 is a schematic sectional view showing a MOS transistor according to a fifth embodiment of the present invention.

A MOS transistor according to a fifth embodiment of the present invention will be now described in conjunction with FIG. 5. The MOS transistor according to the embodiment has a structure substantially the same as that of the MOS transistor according to the first embodiment. In the fifth embodiment, the MOS transistor includes a gate insulating film 54 formed of a general oxide film having a composition different from the gate insulating film 30 on the gate insulating film 30 formed of the silicon oxynitride film. In the MOS transistor including such a layered structure having the gate insulating films 30 and 54, impurity ions in the upper layer gate insulating film 54 can be prevented from diffusing/reacting to/with the lower layer gate insulating film 30. Superior transistor characteristics by the high quality gate insulating film 30 result and reduction in the gate leakage current can be achieved.

Application of the silicon oxynitride films (30 to 33) according to the first to fifth embodiments described above to the gate insulating film of a MOS transistor prevents impurity (boron) ions in the gate electrodes 51 and 52 from penetrating through the silicon oxynitride film (30 to 33), whereby the silicon substrate can be effectively restrained from being degraded.

Figure 6:
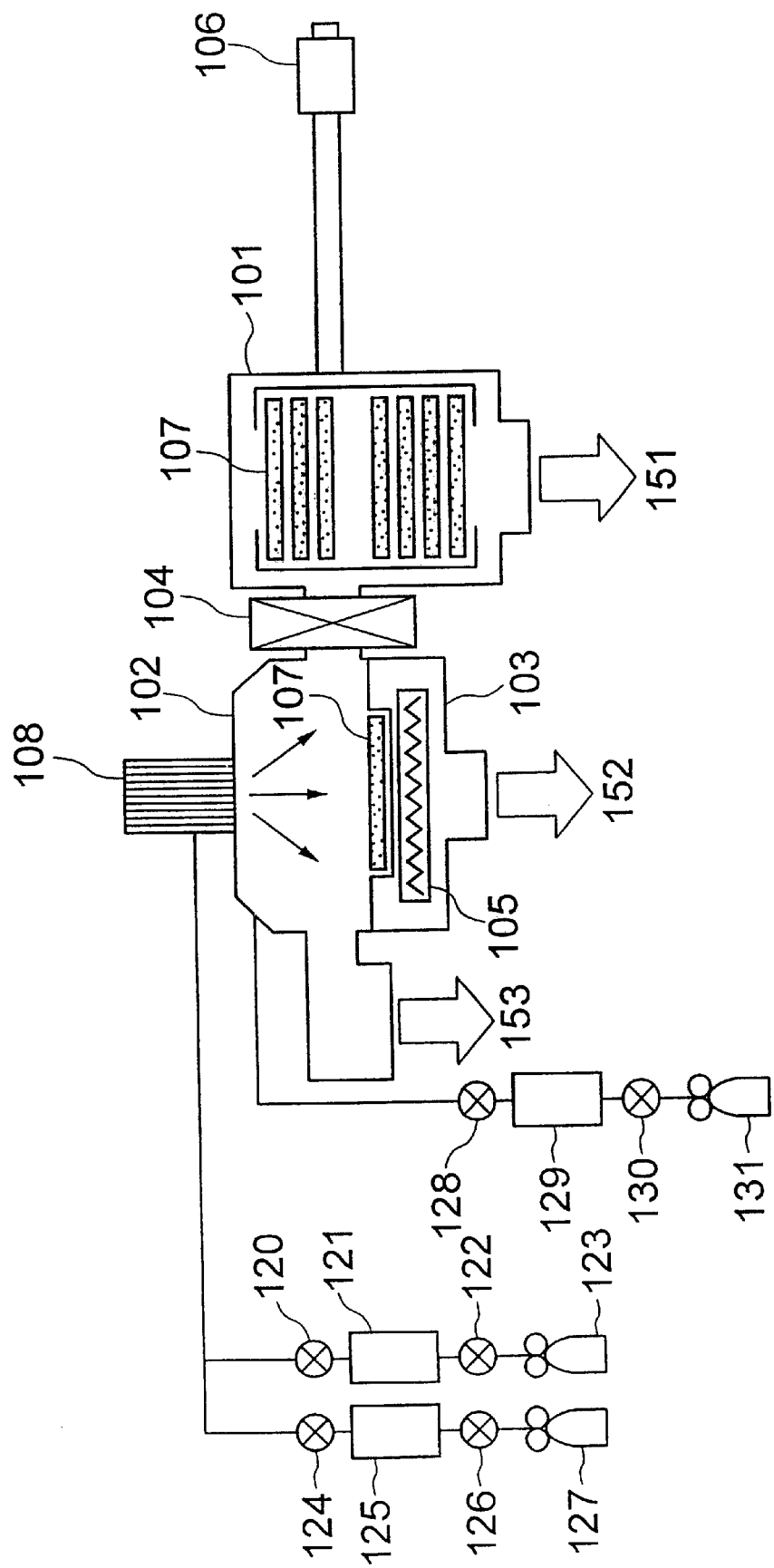
FIG. 6 is a schematic view showing the general structure of a UHV-oxynitride filming unit used in a method of manufacturing a semiconductor device according to the present invention.

A method of manufacturing a MOS transistor according to an embodiment of the present invention will be now described. A UHV-oxynitride filming unit (ultra high-vacuum chamber) used according to the method will be specifically described. FIG. 6 is a schematic view of the general structure of filming unit for forming the oxynitride film.

The UHV-oxynitride filming unit includes an exchange chamber 101, a sample treatment chamber 102, and a heater 103. The exchange chamber 101 can accommodate a plurality of wafers 107. A gate valve 104 is provided between the sample treatment chamber 102 and the exchange chamber 101. Each chamber is exhausted by exhaust systems 151, 152 and 153 including a plurality of pumps.

The exhaust system 153 is provided with a pressure control system, and adjusts the internal pressure of the sample treatment chamber 102. A wafer transport mechanism 106 to move a wafer between the sample treatment chamber 102 and the exchange chamber 101 is provided adjacent to the exchange chamber 101. The wafer transport mechanism 106 allows the wafer to be exchanged or moved without exposing the sample treatment chamber 102 to the air in the UHV-oxynitride filming unit. The sample treatment chamber 102 is provided with a heater 105 to heat the wafer, an ECR plasma source 108 to produce active oxygen O* and active nitrogen N*, and a gas supply system.

The heater 105 can heat the substrate to a temperature of 1200° C. The gas supply system includes an oxygen gas container 123, a nitrogen gas container 127, a disilane gas container 131, stop valves 120, 122, 124, 126, 128 and 130, and mass flow controllers 121, 125, and 129. The gas supply systems 120 to 131 allow an oxygen gas and a nitrogen gas to be introduced through the ECR plasma source 108 into the sample treatment chamber 102. The introduced oxygen gas and nitrogen gas can be adjusted by the mass flow controllers 121, 125 and 129 in the range from $1 \times 10^{-2}$ Pa to 50 Pa.

Using the UHV-oxynitride filming unit, the active oxygen O* and the active nitrogen N* necessary for forming the gate insulating film may be introduced into the sample treatment chamber 102 to achieve the filming conditions according to the present invention. More specifically, the active oxygen O* and active nitrogen N* are supplied by introducing the oxygen gas and the nitrogen gas through the ECR plasma source 108. The flow ratio of the oxygen gas and the nitrogen gas is controlled using the mass flow controllers 121, 125 and 129, and the pressure in the sample treatment chamber 102 is set in the range from 0.1 to 1 Pa.

In an experiment using the UHV-oxynitride filming unit described above, a sample of p-Si 100 having a diameter of 200 mm and a sample having an element isolation region on a silicon substrate where $\rho=0.02$ Ωcm are used. In the element isolation, a thermally oxidized film is formed on the silicon substrate and then a silicon nitride film to serve as a mask at the time of selectively oxidizing the element isolation region is coated thereon. Then, patterning is performed to leave the silicon nitride film only in an element region, and impurity ions of the same type as that of the conductivity type of the silicon substrate are introduced in the element isolation region followed by formation of a thick oxide film. The sample is subjected to a wet cleaning process (APM cleaning, pure water cleaning, HF cleaning, pure water cleaning and IPA drying in this order), and then immediately transported to the UHV-oxynitride filming unit.

The APM cleaning was conducted for five minutes in a chemical mixture solution of $NH_4OH:H_2O_2:H_2O$ in the ratio of 1:6:20 heated up to 65° C. Then, pure water cleaning by rapid damping was conducted twice, and a treatment in a chemical solution of $HF:H_2O$ in the ratio of 1:50 was conducted for 45 seconds. Then, over flow pure water cleaning was conducted for two minutes, and finally the IPA is drying was conducted to remove water droplets from the wafer surface. After the wet cleaning, the wafer was immediately transported to the exchange chamber 101 in the UHV-oxynitride filming unit.

The vacuum degree in the exchange chamber 101 was set to $1.33 \times 10^{-5}$ Pa ($1.0 \times 10^{-7}$ Torr) or less, and the vacuum degree in the sample treatment chamber 102 was set to $1.33 \times 10^{-7}$ Pa ($1.0 \times 10^{-9}$ Torr) or less. After sufficiently exhausted in this exchange chamber 101, the sample was transported to the sample treatment chamber 102. The transported sample was annealed for five minutes at a temperature of 920° C. from the bottom surface using the heater 105. As a result, a native oxide film formed after the cleaning desorbed from the Si surface to expose the Si cleaned surface. Thus, a flat surface in the structure of atoms was formed on the Si cleaned surface.

Then, while the sample temperature was kept at 620° C., a gate oxynitride film was formed by the manufacturing method according to the present invention. Then, while the sample was kept at 650° C., disilane was allowed to flow at a flow rate of 1.0 sccm, and gate electrode polysilicon was deposited. In this example, the sample was later taken out into the atmosphere, and a MOS-FET was manufactured.

Figure 7A:
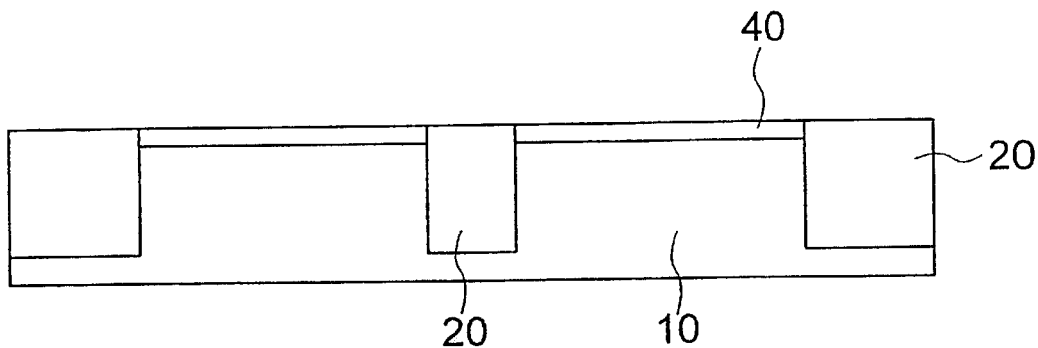
FIGS. 7A to 7C are sectional views showing a method of manufacturing a semiconductor device according to the present invention, illustrating the process step by step.
Figure 7B:
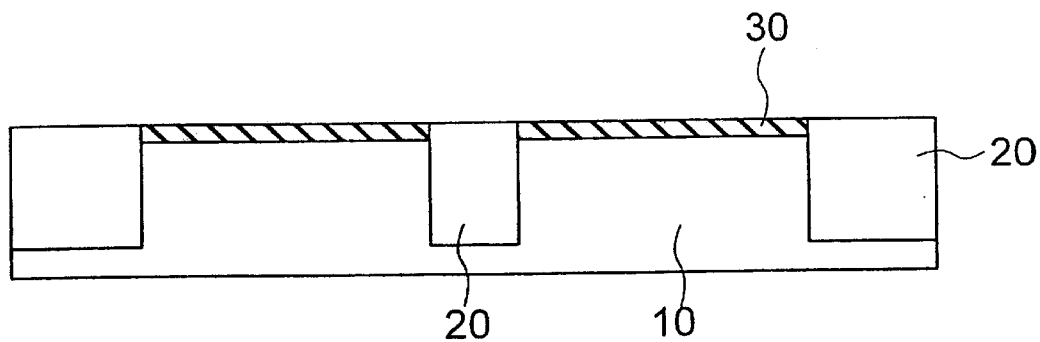
Figure 7C:
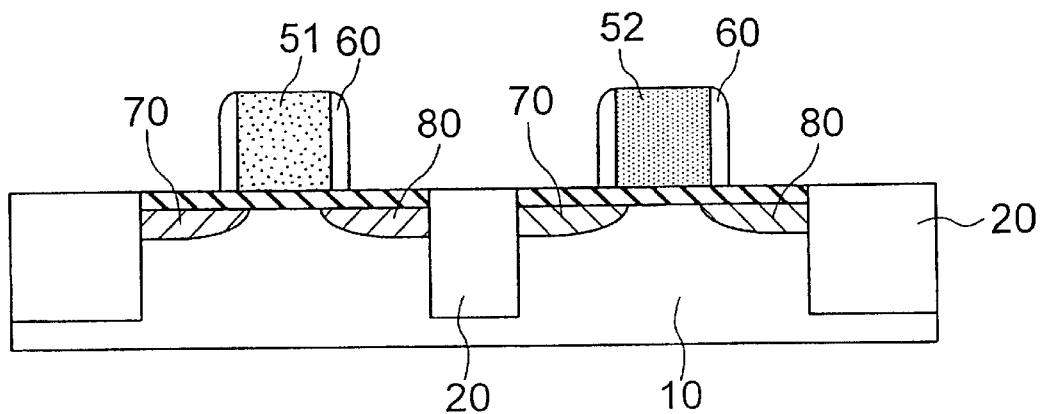
Figure 8A:
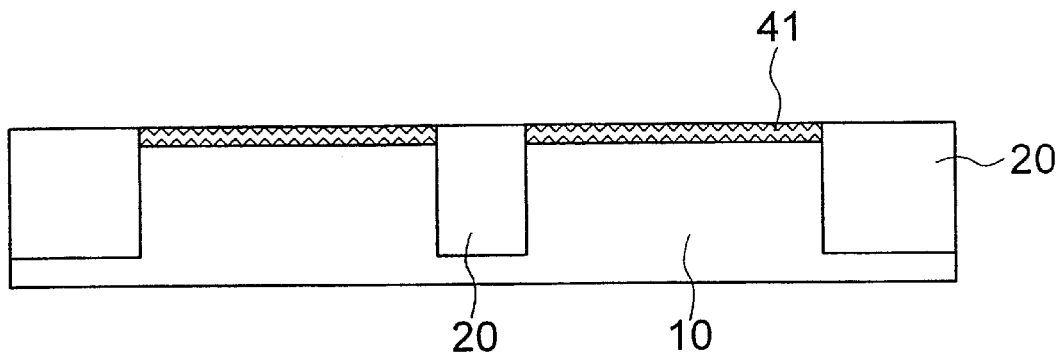
FIGS. 8A to 8C are sectional views showing another manufacturing method according to the present invention, illustrating the process step by step.
Figure 8B:
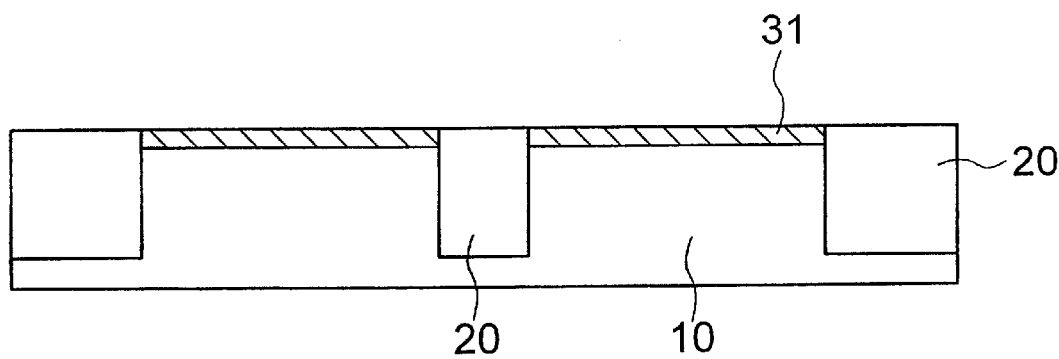
Figure 8C:
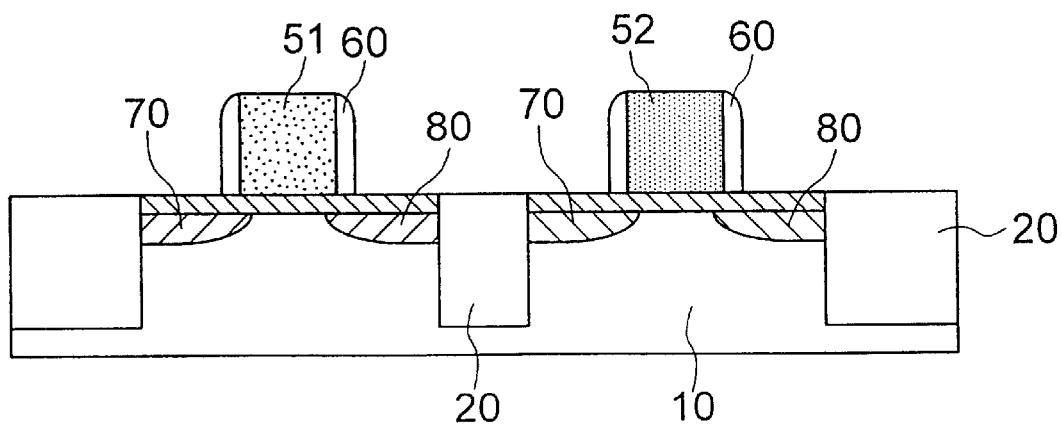

A method of manufacturing a semiconductor device according an embodiment of to the present invention (the third radical process (N*→O*)) will be now described in conjunction with FIGS. 7A to 7C. FIGS. 7A to 7C are sectional views showing the process step by step. As shown in FIG. 7A, a silicon oxide film 40 having a thickness of 1 nm to 3 nm is formed on a silicon substrate 10 by general thermal oxidation. Then, the silicon oxide film 40 is nitrided at a temperature in the range from 300° C. to 900° C. using active nitrogen formed by plasma excitation of a nitrogen gas. Thus, as shown in FIG. 7B, a silicon oxynitride film 30 having a thickness from 1 nm to 3 nm is formed. An ordinary process of forming gate electrodes 51 and 52 and an ordinary process of forming a source region 70 and a drain region 80 are conducted as shown in FIG. 7C to complete the MOS transistor Another method of manufacturing a semiconductor device according to the present invention (the first radical process (O*→N*)) will be now described in conjunction with FIGS. 8A to 8C. FIGS. 8A to 8C are sectional views showing the process step by step. As shown in FIG. 8A, a silicon oxide film 41 having a thickness in the range from 1 nm to 3 nm is formed on a silicon substrate 10 by an oxidizing method using active oxygen. Then, the silicon oxide film 41 is nitrided at a temperature in the range from 300° C. to 900° C. using active nitrogen formed by plasma excitation of a nitrogen gas. Thus, as shown in FIG. 8B, a silicon oxynitride film 31 having a thickness in the range from 1 nm to 3 nm is formed. Then, a general step of forming electrodes 51 and 52, and a general step of forming a source region 70 and a drain region 80 are performed to complete the MOS transistor as shown in FIG. 8C.

Figure 9A:
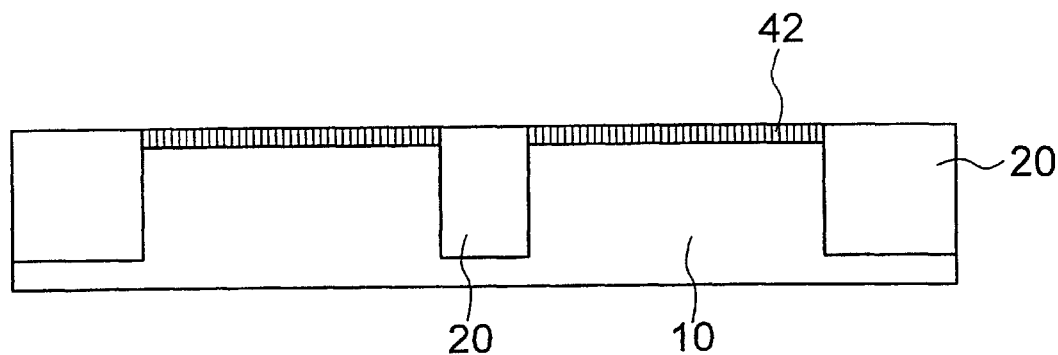
FIGS. 9A and 9B are sectional views showing yet another method of manufacturing a semiconductor device according to the present invention, illustrating the process step by step.
Figure 9B:
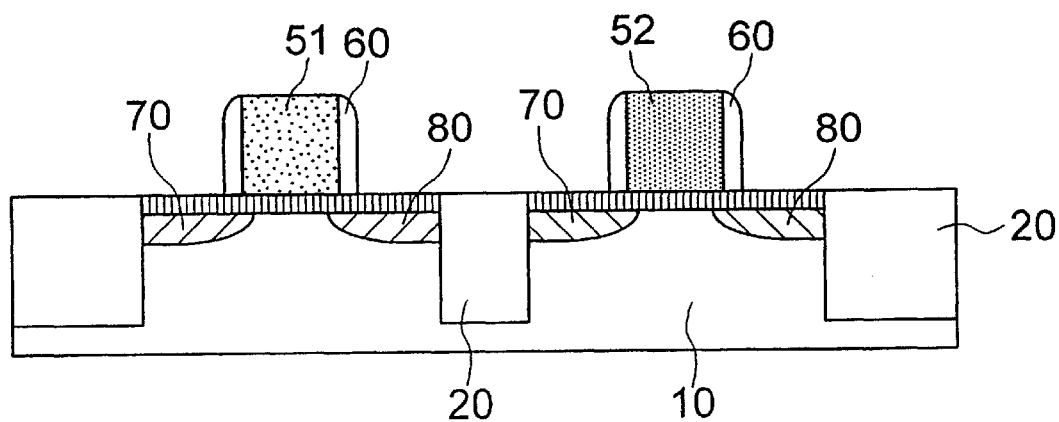

Still another method of manufacturing a semiconductor device (by the second radical process (O*+N*)) according to the present invention will be described in conjunction with FIGS. 9A and 9B. FIGS. 9A and 9B are sectional views showing the process step by step. As shown in FIG. 9A, a silicon oxynitride film 42 having a thickness in the range from 1 nm to 3 nm is formed on a silicon substrate 10 in a single process by oxynitriding at a temperature in the range from 300° C. to 900° C. using active oxygen and active nitrogen. Thereafter, a general step of forming gate electrodes 51 and 52 and a step of forming a source region 70 and a drain region 80 are performed to complete the MOS transistor.

According to the above described manufacturing methods, the penetration of impurity ions in the gate electrode to the silicon substrate surface through the gate insulating film caused in the manufacturing step of the MOS transistor having a thickness in the range from 1 nm to 3 nm can be completely solved. The roughness of the interface between the silicon oxynitride film and the silicon substrate can be significantly reduced. Furthermore, using the silicon oxynitride film for the gate insulating film in the MOS transistor, the mobility of electrons or holes can be maintained in the same level as a general silicon oxide film. Meanwhile, the gate leakage current in the gate oxynitride film having a thickness in the range from 1 nm to 3 nm can be reduced by one to two orders of magnitude.

According to these methods, active species of oxygen or nitrogen are formed by ECR plasma excitation of an oxygen gas or a nitrogen gas, while the active species may be produced by excitation using ICP, RF plasma or helicon wave plasma. Alternatively, photo excitation of an oxygen gas or a nitrogen gas may be employed.

An oxynitride film may be formed using only neutral radicals of oxygen or nitrogen as the active species. For example, among the active species formed in a plasma excitation chamber, neutral radicals having a relatively long lifetime may be taken out by a down flow method, and the taken neutral radicals are directed upon the surface of the silicon substrate. Thus, the oxynitride film is formed by a reaction between the neutral radicals and the surface of the silicon substrate. According to the method, the active species can be controlled to be one kind, and therefore the quality of the resultant oxynitride film can be even more improved.

According to the above manufacturing methods, the treatment temperature is set in the range from 300° C. to 900° C. This is because an oxynitriding reaction with a highly reactive active species is employed rather than a thermal reaction, and according to the present invention, an oxynitride film may be formed at a temperature lower than the conventional method. It is to be noted that the silicon oxynitride film in the present invention may be applied to a capacitor insulator film in a stacked capacitor for a DRAM or the like.

Since the above embodiments are described only for examples, the present invention is not limited to the above embodiments and various modifications or alterations can be easily made therefrom by those skilled in the art without departing from the scope of the present invention.

What is claimed is:

1. A semiconductor device comprising an active element having a silicon oxynitride film including silicon nitride and silicon oxide as main components thereof, said silicon oxynitride film having a first specific dielectric constant which is larger than a second specific dielectric constant theoretically calculated from a weighted average of a specific dielectric constant of silicon oxide and a specific dielectric constant of silicon nitride, the weighted average being based on a weight ratio between the silicon nitride and the silicon oxide in said silicon oxynitride film.

2. The semiconductor device as defined in claim 1 wherein said first specific dielectric constant ($\epsilon$) satisfies the following relationship:

$$\epsilon > (1-x) \times 3.9 + x \times 7.5$$

where the specific dielectric constant of silicon oxide is assumed at 3.9, the specific dielectric constant of silicon nitride is assumed at 7.5, and x is the weight ratio of the silicon nitride to said silicon oxynitride film.

3. The semiconductor device as defined in claim 1, wherein said first specific dielectric constant is equal to or more than 4.5 and below 6.0, and said the weight ratio of the silicon nitride to said silicon oxynitride film is between 0.05 and 0.5.

4. The semiconductor device as defined in claim 1, wherein said first specific dielectric constant is equal to or more than 6.0 and below 6.5, and the weight ratio of the silicon nitride to said silicon oxynitride film is between 0.05 and 0.45.

5. The semiconductor device as defined in claim 1, wherein said first specific dielectric constant is equal to or more than 6.5 and below 7.5, and the weight ratio of the silicon nitride to said silicon oxynitride film is between 0.05 and 0.4.

6. The semiconductor device as defined in claim 1, wherein said silicon oxynitride film has a physical thickness of 1.5 to 4.5 nm corresponding to an equivalent oxide-film thickness of 1 to 3 nm.

7. The semiconductor device as defined in claim 1, wherein a nitrogen distribution in said silicon oxynitride film resides within 1 nm from a top surface thereof, and a nitrogen peak position resides on the top surface side as viewed from a center of said silicon oxynitride film.

8. The semiconductor device as defined in claim 1, wherein said active element is a MIS transistor having a gate insulating film including said silicon oxynitride film.

9. The semiconductor device as defined in claim 8, wherein said gate insulating film further includes another insulating film between said silicon oxynitride film and a gate electrode of said MIS transistor.

10. A method for forming a semiconductor device including a MIS transistor comprising the steps of:

forming source/drain/channel regions of the MIS transistor on a silicon substrate;

forming a silicon oxide film on said silicon substrate in association with said source/drain/channel regions by using active oxygen; and nitriding said silicon oxide film by using active nitrogen to form a silicon oxynitride film as a gate insulating film of the MIS transistor, said silicon oxide film forming step and said nitriding step being conducted continuously in a single chamber while controlling a pressure inside said single chamber and electric power so that said silicon oxynitride film has a specific dielectric constant which is larger than an expected specific dielectric constant theoretically calculated from an amount of said active nitrogen used.

11. The method as defined in claim 10, wherein said pressure is between $0.1. \times 10^{-2}$ Pa and $10 \times 10^{-2}$ Pa, and said electric power is between 100 watts and 300 watts.

12. A method for forming a semiconductor device including a MIS transistor comprising the steps of:

forming source/drain/channel regions of the MIS transistor on a silicon substrate; and forming a silicon oxynitride film as a gate insulating film of the MIS transistor on said silicon substrate in association with said source/drain/channel regions by using active oxygen and active nitrogen, said silicon oxynitride film forming step being conducted while controlling a pressure inside a chamber and electric power so that said silicon oxynitride film has a specific dielectric constant which is larger than an expected specific dielectric constant theoretically calculated from an amount of said active nitrogen used.

13. The method as defined in claim 12, wherein said pressure is between $0.1 \times 10^{-2}$ Pa and $10 \times 10^{-2}$ Pa, and said electric power is between 100 watts and 300 watts.

14. A method for forming a semiconductor device including a MIS transistor comprising the steps of:

forming source/drain/channel regions of the MIS transistor on a silicon substrate;

forming a silicon nitride film on said silicon substrate in association with said source/drain/channel regions by using active nitrogen; and oxidizing said silicon nitride film by using active oxygen to form a silicon oxynitride film as a gate insulating film of the MIS transistor, said silicon nitride film forming step and said oxidizing step being conducted continuously in a single chamber while controlling a pressure inside said single chamber and electric power so that said silicon oxynitride film has a specific dielectric constant which is larger than an expected specific dielectric constant theoretically calculated from an amount of said active nitrogen used.

15. The method as defined in claim 14, wherein said pressure is between $0.1 \times 10^{-2}$ Pa and $10 \times 10^{-2}$ Pa, and said electric power is between 100 watts and 300 watts.

16. The semiconductor device as defined in claim 1, wherein said silicon oxynitride is formed using active oxygen and active nitrogen.

17. The semiconductor device as defined in claim 2, wherein $0<x<0.1$ and the first dielectric constant is at least 6, but less than 7.5.

* * * * *

UNITED STATES PATENT AND TRADEMARK OFFICE
CERTIFICATE OF CORRECTION

PATENT NO.     : 6,459,126 B1                                          Page 1 of 1
DATED          : October 1, 2002
INVENTOR(S)    : Tohru Mogami et al.

It is certified that error appears in the above-identified patent and that said Letters Patent is hereby corrected as shown below:

Column 9,
Line 39, delete "$V_{TH}=((2\in_S\in_0 q^N et)_{½}/C_{ox})(V_B+2\phi_F)^{½}+V_{FB}+2\phi F$" insert
-- $V_{TH}=((2\in_S\in_0 q N_{ch})^{½}/Cox)(V_B+2\phi_F)^{½}+V_{FB}+2\phi_F.....$ --;

Line 58, delete "$T_{OX\text{-}eq*}.$" insert -- $T_{OX\text{-}eg.}$ --

Column 12,
Line 67, after "film" insert -- The --

Column 13,
Line 40, delete "1 x X" insert -- 1-x --

Column 20,
Line 36, delete "<0.1)" insert -- ≤0.1 --

Signed and Sealed this

Twenty-ninth Day of April, 2003

JAMES E. ROGAN
*Director of the United States Patent and Trademark Office*